United States Patent
Koike (10) Patent No.: US 9,946,001 B2
(45) Date of Patent: *Apr. 17, 2018

(54) PHASE DIFFERENCE ELEMENT HAVING BIREFRINGENT FILM CONTAINING TITANIUM OXIDE TANTALUM OXIDE

(71) Applicant: DEXERIALS CORPORATION, Tokyo (JP)

(72) Inventor: Nobuyuki Koike, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/194,056

(22) Filed: Jun. 27, 2016

(65) Prior Publication Data

US 2016/0356936 A1  Dec. 8, 2016

Related U.S. Application Data

(62) Division of application No. 13/468,388, filed on May 10, 2012, now Pat. No. 9,376,744.

(30) Foreign Application Priority Data

May 16, 2011 (JP) .................. 2011-109843
Mar. 16, 2012 (JP) .................. 2012-059618

(51) Int. Cl.
*G02B 5/30* (2006.01)
*G02B 27/28* (2006.01)
(Continued)

(52) U.S. Cl.
CPC .......... *G02B 5/3083* (2013.01); *C23C 14/083* (2013.01); *C23C 14/226* (2013.01);
(Continued)

(58) Field of Classification Search
CPC .... G02B 5/1833; G02B 5/285; G02B 5/3083; G02B 1/10; G02B 1/115; G02B 6/132; G02B 27/142; G02B 27/283
(Continued)

(56) References Cited

U.S. PATENT DOCUMENTS 4,536,063 A    8/1985  Southwell
4,657,350 A    4/1987  Mori
(Continued)

FOREIGN PATENT DOCUMENTS

JP    S59-49508 A    3/1984
JP    S63-132203 A   6/1988
(Continued)

OTHER PUBLICATIONS

Lee, et al. "TiO2-Ta2O5 composite thin films deposited by radio frequency ion-beam sputtering," Applied Optics, vol. 45, No. 36 (Dec. 20, 2006): 9125-9131.*
(Continued)

*Primary Examiner* — Thomas K Pham
*Assistant Examiner* — Nicholas R Pasko
(74) *Attorney, Agent, or Firm* — Oliff PLC (57) ABSTRACT

A phase difference element has a transparent substrate and a birefringent film with tantalum oxide and titanium oxide obliquely deposited on one surface of the transparent substrate. The birefringent film has a first photorefractive film and a second photorefractive film laminated to each other and having different oblique deposition directions. The ratio of titanium atoms to the total of titanium atoms and tantalum atoms in the birefringent film is 4.0 atomic % or higher to 30 atomic % or lower.

9 Claims, 7 Drawing Sheets

(51) Int. Cl.
*B05D 5/06* (2006.01)
*C23C 14/08* (2006.01)
*C23C 14/58* (2006.01)
*G02F 1/01* (2006.01)
*G02F 1/13363* (2006.01)
*C23C 14/22* (2006.01)
*G02B 5/32* (2006.01)

(52) U.S. Cl.
CPC ...... *C23C 14/5806* (2013.01); *C23C 14/5886* (2013.01); *G02F 1/0126* (2013.01); *G02F 1/13363* (2013.01); *C23C 14/225* (2013.01); *G02B 5/32* (2013.01); *G02F 2202/13* (2013.01); *Y10T 428/24612* (2015.01)

(58) Field of Classification Search
USPC ............ 359/489.01, 489.06, 489.07, 489.15; 349/96; 427/164–167
See application file for complete search history.

(56) References Cited

U.S. PATENT DOCUMENTS

| | | | |
|---|---|---|---|
| 4,874,664 A * | 10/1989 | Hamaguchi | C23C 14/226 428/325 |
| 4,940,636 A | 7/1990 | Brock et al. | |
| 5,458,084 A | 10/1995 | Thorne et al. | |
| 5,739,952 A | 4/1998 | Takeda et al. | |
| 5,781,345 A | 7/1998 | Ferrante et al. | |
| 5,866,204 A | 2/1999 | Robbie et al. | |
| 5,920,431 A | 7/1999 | Tokuhiro et al. | |
| 5,932,354 A | 8/1999 | Takeda et al. | |
| 6,187,445 B1 | 2/2001 | Ito et al. | |
| 6,506,288 B1 | 1/2003 | Edlinger et al. | |
| 6,599,618 B1 | 7/2003 | Simmon, Jr. | |
| 6,872,452 B2 * | 3/2005 | Taninaka | C23C 14/083 204/192.1 |
| 6,922,287 B2 * | 7/2005 | Wiki | G02B 5/1814 359/489.06 |
| 7,081,705 B2 | 7/2006 | Hori et al. | |
| 7,136,217 B2 * | 11/2006 | Kawakami | B82Y 20/00 359/321 |
| 7,544,273 B2 | 6/2009 | Taneda et al. | |
| 9,376,744 B2 * | 6/2016 | Koike | C23C 14/083 |
| 2006/0126066 A1 * | 6/2006 | Kawakami | G02B 27/288 356/364 |
| 2007/0165308 A1 | 7/2007 | Wang et al. | |

FOREIGN PATENT DOCUMENTS

| | | | | |
|---|---|---|---|---|
| JP | H05-134115 A | | 5/1993 | |
| JP | H09-145924 A | | 6/1997 | |
| JP | H09-277395 A | | 10/1997 | |
| JP | H09-297214 A | | 11/1997 | |
| JP | H10-81955 A | | 3/1998 | |
| JP | H11-109129 A | | 4/1999 | |
| JP | 2001-108832 A | | 4/2001 | |
| JP | 2001108832 A | * | 4/2001 | |
| JP | 2001-228330 A | | 8/2001 | |
| JP | 4009044 B2 | | 11/2007 | |
| JP | 2008-216644 A | | 9/2008 | |
| WO | WO 2011148465 A1 | * | 12/2011 | ........... G02B 5/3083 |

OTHER PUBLICATIONS

Tang et al. "Analysis of (TiO2)x(Ta2O5)1-x composite films prepared by Radio Frequency Ion Beam Sputtering Deposition," Advances in Thin-Film Coatings for Optical Applications III, Proc. of SPIE vol. 6286, 628603, (2006), doi: 10.1117/12.676233.*
English Machine Translation of JP 2001108832 A.*
Lee, et al. "TiO2-Ta2O5 composite thin films deposited by radio frequency ion-beam sputtering," Applied Optics, vol. 45, No. 36 (Dec. 20, 2006): 9125-9131.*
Tang et al. "Analysis of (TiO2)x(Ta2O5)1—x composite films prepared by Radio Frequency Ion Beam Sputtering Deposition," Advances in Thin-Film Coatings for Optical Applications III, Proc. of SPIE vol. 6286, 628603, (2006), doi: 10.1117/12.676233.*
Fujimoto et al.; "Higher Luminescence LED Using Nanostructured Surface Fabricated by Self-Assembled Block Copolymer Lithography;" Toshiba Review; 2005; pp. 32-35; vol. 60, No. 10.

* cited by examiner

PHASE DIFFERENCE ELEMENT HAVING BIREFRINGENT FILM CONTAINING TITANIUM OXIDE TANTALUM OXIDE

The present application is a divisional application of U.S. patent application Ser. No. 13/468,388 filed May 10, 2012, incorporated herein by reference in its entirety.

FIELD OF THE INVENTION

The present invention relates to a phase difference element which can be used for a half-wave plate, a quarter-wave plate and the like.

BACKGROUND OF THE INVENTION

Conventionally, a phase difference element (for example, a wave plate) has been made from an inorganic optical single crystal, such as a quartz crystal, and a polymeric stretched film. However, although the inorganic optical single crystal has excellent performance, durability and reliability as a phase difference element, it has the disadvantages of high cost of raw materials and their processing. The polymeric stretched film, on the other hand, has the disadvantages of low durability since it tends to deteriorate due to heat and UV radiation.

An oblique deposited film having an oblique columnar structure, by the way, has been expected to be used as an oblique deposited phase difference element. It is based on that any phase differences can be set by adjusting the film thickness in principle, enlargement of the film area is relatively easy, and low cost and mass production can be achieved.

The below Patent Literatures 1 to 7 describe oblique deposited phase difference elements. In Patent Literatures 1 to 3 among them, $Ta_2O_5$ with excellent heat resistance is used as a deposition material. This $Ta_2O_5$ is a material having a high refractive index (approximately 2.2) and the oblique deposited film made therefrom has high birefringence, whereas not only $Ta_2O_5$ but also the optical thin film formed by oblique deposition has lower transmittance of light due to larger optical loss than the optical thin film formed by ordinary deposition techniques. Moreover, the oblique deposited phase difference element is required to have a film thickness of one to several μm to serve as a wave plate, and thicker film thickness is more sensitive to the optical loss.

Patent Literature 8 discloses a method for laminating a number of oblique deposited thin films and front deposited thin films to decrease the optical loss. In this method, each oblique deposited film is thinned to stabilize the acicular structure of a deposition substance, and the front deposited film with high density is disposed between oblique deposited films to increase mechanical strength of the film.

In addition, Patent Literature 9 describes a method in combination with a plasma source or an ion source in a deposition apparatus 1, the method including applying a deposition substance in a high energy state to a substrate by taking advantages of plasma formed in the apparatus to increase the adhesion of the deposition substance to the substrate and thereby decrease the optical loss.

The methods disclosed in Patent Literatures 8 and 9, however, have the problems of a longer lead time, limited deposition apparatus and so on because the optical loss of the film is decreased by a complex film configuration and apparatus structure.

Also, with regard to an oblique deposited phase difference element as a phase difference element having excellent heat resistance, there has been the problem of spectral transmittance properties in applying to a wave plate due to a demand for increased luminance in a projector for years. In particular, for the wave plate required to have a thickness of oblique deposited film ranging from one to several μm, transmittance is markedly decreased in the wavelength range of from 400 to 500 nm, thereby causing the problem of, for example, decreased luminance of blue light when applied to a liquid crystal projector.

LIST OF THE PRIOR ART

Patent Literature

Patent Literature 1: JP 9-145924 A
Patent Literature 2: JP 9-297214 A
Patent Literature 3: JP 2001-228330 A
Patent Literature 4: JP 59-49508 A
Patent Literature 5: JP 63-132203 A
Patent Literature 6: JP 5-134115 A
Patent Literature 7: JP 11-109129 A
Patent Literature 8: JP 10-81955 A
Patent Literature 9: JP 4009044 B

SUMMARY OF THE INVENTION

Problem(s) to be Solved by the Invention

It is an object of the present invention is to provide, for an oblique deposited phase difference element, a phase difference element having light transmittance significantly increased by a material composition of oblique deposition that can be relatively easily adjusted, not by modification of a film configuration or a deposition apparatus.

Means for Solving the Problem(s)

To solve the above-mentioned problems, the present invention provides a phase difference element having a transparent substrate and a birefringent film in which tantalum oxide and titanium oxide are obliquely deposited on one surface of the transparent substrate, wherein the birefringent film has a first photorefractive film and a second photorefractive film laminated to each other and having different oblique deposition directions, and the ratio of titanium atoms to the total of titanium atoms and tantalum atoms in the birefringent film is 4.0 atomic % or higher and 30 atomic % or lower, and preferably 10 atomic % or higher and 20 atomic % or lower.

The present invention also provides a phase difference element, having a transparent substrate and a birefringent film, the birefringent film including a first photorefractive film and a second photorefractive film, the first photorefractive film being grown on the transparent substrate along a first oblique direction from which a material vapor enters, the material vapor being emitted from a deposition material containing $Ta_2O_5$ and $TiO_2$ and going straight ahead, and the second photorefractive film being grown on the first photorefractive film along a second oblique direction from which the material vapor enters, the second oblique direction being different from the first oblique direction, wherein the ratio of Ti (titanium atom) to the total of Ta (tantalum atom) and Ti, (Ti/(Ta+Ti)), of the first and the second photorefractive films is 4.0 atomic % or higher and 30 atomic % or lower, and preferably 10 atomic % or higher and 20 atomic % or lower.

The present invention also provides the phase difference element, wherein the birefringent film has the first and the second photorefractive films alternately laminated in a plurality of layers.

The present invention also provides the phase difference element, wherein the transparent substrate is a quartz glass substrate.

The present invention also provides the phase difference element, wherein a component parallel to the front surface of the transparent substrate in the first oblique direction and a component parallel to the front surface of the transparent substrate in the second oblique direction are directed to respective directions opposite to each other.

The invention also provides a display device having the phase difference element described above, and a liquid crystal, in which light passing through the liquid crystal and the phase difference element is emitted outside.

The invention also provides a method for producing a phase difference element, comprising obliquely depositing $Ta_2O_5$ and $TiO_2$ on a transparent substrate in a first oblique direction to form a first photorefractive film, and obliquely depositing $Ta_2O_5$ and $TiO_2$ on the first photorefractive film in a second oblique direction to form a second photorefractive film, the second oblique direction being different from the first oblique direction, thereby forming a birefringent film having the first photorefractive film and the second photorefractive film laminated to each other, wherein $Ta_2O_5$ and $TiO_2$ are obliquely deposited such that the ratio of titanium atoms to the total of titanium atoms and tantalum atoms in the birefringent film is 4.0 atomic % or higher to 30 atomic % or lower.

Advantage(s) of the Invention

The phase difference element of the present invention has considerably higher transmittance than a conventional phase difference element, so that visible light can be allowed to transmit the phase difference element of the invention while maintaining its high intensity. Therefore, the phase difference element of the present invention has high transparency and high birefringence. Further, since the birefringent film is formed from an inorganic material, the phase difference element of the invention also has excellent heat resistance. Therefore, in particular, when the phase difference element of the invention is employed in a liquid crystal display device such as a liquid crystal projector from which diffused light is emitted, light with a high intensity can be emitted due to high transmittance, and an optical unit part also can be downsized due to high heat resistance.

DETAILED DESCRIPTION OF THE INVENTION

The phase difference element of the present invention will be described according to the production process thereof.

Figure 1:
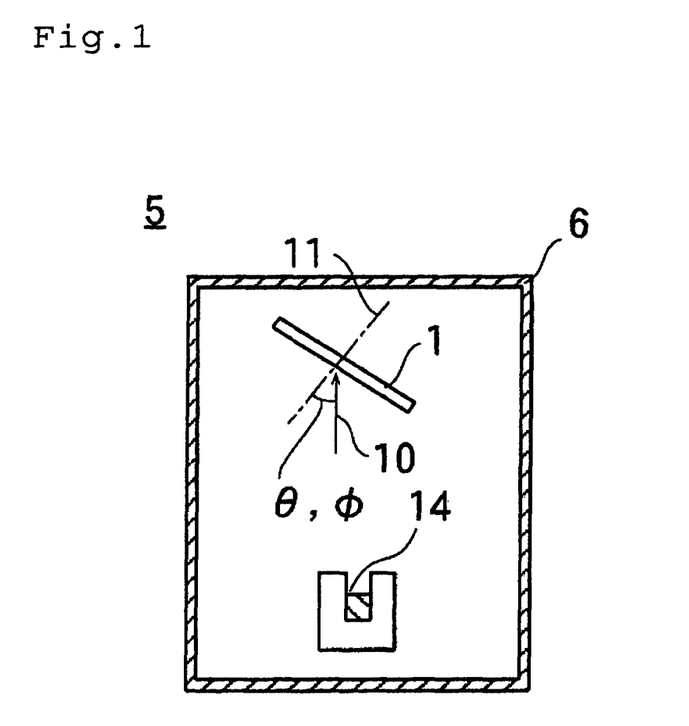
FIG. 1 is a schematic diagram illustrating an example of the deposition apparatus used for the present invention.
Figure 2A:
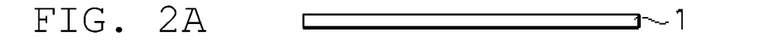
FIGS. 2A to 2E are schematic diagrams illustrating the process for producing the phase difference element of the present invention.

As shown in FIG. 1, a deposition material 14 containing $Ta_2O_5$ and $TiO_2$ is disposed beforehand in a vacuum chamber 6 of a deposition apparatus 5, and a transparent substrate 1 of FIG. 2A is installed into the vacuum chamber 6. The transparent substrate 1 is disposed at the position above the deposition material 14 with the front surface of the transparent substrate 1 being oblique to the deposition material 14. As the transparent substrate 1 disposed at an oblique angle in the vacuum chamber 6, the substrate made of quartz glass can be preferably used, but any types of transparent materials can be used as long as they can withstand deposition conditions.

Figure 2B:
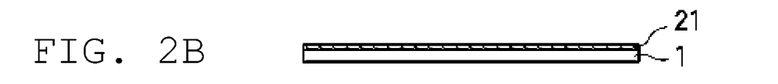

The deposition material 14 is then heated in the vacuum chamber 6 under vacuum atmosphere, and a material vapor containing a mixture of $Ta_2O_5$ vapor and $TiO_2$ vapor is emitted into the vacuum chamber 6 and allowed to enter (deposited on) the front surface of the transparent substrate 1 from a first oblique direction to form a first refractive film 21 on the transparent substrate 1 as shown in FIG. 2B.

Figure 3:
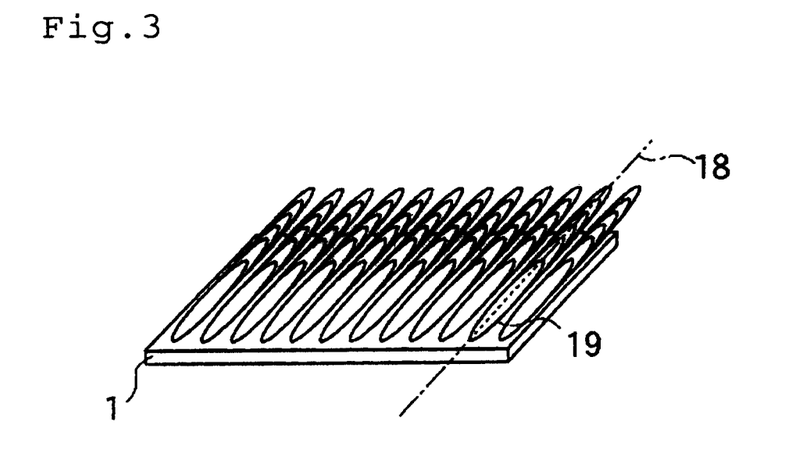
FIG. 3 is a schematic diagram illustrating the structure of the thin film formed by oblique deposition.

A crystal grain 19 constituting the first refractive film 21 is grown along the first oblique direction 18 from which the material vapor enters as shown FIG. 3.

The first refractive film 21 is formed to have a predetermined thickness, and subsequently the transparent substrate 1 is rotated 180° about a center line 11 that is perpendicular to the front surface thereof and passes through the center of the front surface.

Figure 2C:
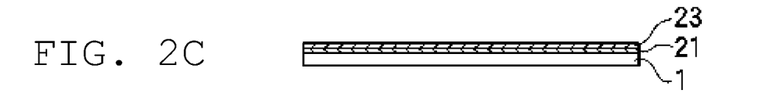

Accordingly, as viewed from the transparent substrate 1, the material vapor enters the front surface of the first refractive film 21 from a second oblique direction, which is different from the first oblique direction, to form a second refractive film 23 on the front surface of the first refractive film 21 as shown in FIG. 2C.

The arrow designated by reference numeral 10 in FIG. 1 represents the traveling direction of the material vapor, and reference numeral 11 represents the normal perpendicular to the front surface of transparent substrate 1 on which the thin film is formed. The first oblique direction and the normal 11 of the transparent substrate 1 are set to form a first angle θ of preferably 60° or larger and 80° or smaller. The second oblique direction and the normal 11 are also set to form a second angle φ of preferably 60° or larger and 80° or smaller.

Here, the first angle θ and the second angle φ have the same value, but they have different incident direction to the transparent substrate 1. In particular, since the transparent substrate 1 is rotated 180° about the center line, a component parallel to the front surface of the transparent substrate 1 in the first oblique direction and a component parallel to the front surface of the transparent substrate 1 in the second oblique direction are directed to respective directions opposite to each other. In short, the angle formed by the component parallel to the transparent substrate 1 in the first oblique direction and the component parallel to the transparent substrate 1 in the second oblique direction is 180°.

After the second refractive film 23 is formed to have a predetermined thickness, the transparent substrate 1 is rotated 180° about the center line, and the material vapor is allowed to enter the front surface of the second refractive film 23 from the first oblique direction to form another first refractive film 21 on the front surface of the second refractive film 23.

In this manner, with the material vapor having the same composition, rotation of the transparent substrate 1 by 180° allows switchover between the first refractive film 21 and the second refractive film 23 to be formed.

Figure 2D:
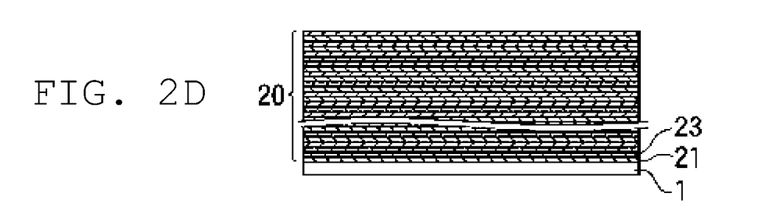

When the first refractive films 21 and the second refractive films 23 are alternately laminated in a plurality of layers, as shown in FIG. 2D, a birefringent film 20 including a plurality of the first refractive films 21 and the second refractive films 23 alternately laminated is formed on the front surface of the transparent substrate 1. A plurality of layers of the first refractive films 21 and a plurality of layers of the second refractive films 23 are present. The total thickness of the birefringent film 20 may be 6 µm in this case, but is not limited to thereto.

The first angle θ may have different value from the second angle φ. Also, the rotation angle is not limited to 180° and may be, for example, 30°, 45°, 60°, or 90°.

The first and the second refractive films 21 and 23 preferably have the same composition. The birefringent film 20 is an oxide thin film adjusted to have the value of Ti/(Ti+Ta) (wherein, "Ti" and "Ta" represent the number of titanium atoms and the number of tantalum atoms, respectively.) of 4.0 atomic % or larger and 30 atomic % or lower, thereby obtaining significantly increased light transmittance of linear polarization with respect to visible light.

The value of Ti/(Ti+Ta) in the birefringent film 20 can be adjusted by controlling the ratio of $Ta_2O_5$ and $TiO_2$ in the deposition material and the temperature of deposition, etc. Therefore, the compositions of the first and the second refractive films 21 and 23 can be different from each other.

When water is attached between columnar constitutions of the first and the second refractive films 21 and 23 constituting the birefringent film 20, the refractive index of the first and second refractive films 21 and 23 is changed thereby to cause characteristics of the birefringent film 20 to largely vary. Therefore, it is preferable to perform an annealing treatment on the formed birefringent film 20, for example, heating at 200° C. to decolor the birefringent film 20 and remove water adsorbed between columnar constitutions of the birefringent film 20 by evaporation.

Preferred examples of the annealing treatment include the treatment of increasing the temperature of the birefringent film 20 to the temperature at which water is actively evaporated (for example, the temperature of 100° C. or higher). However, when the temperature is too high, the columnar constitutions are grown with each other to form columns and thereby to cause decreased birefringence and decreased transmittance, etc. Thus, the temperature of the annealing treatment is preferably set to 300° C. or less.

Figure 2E:
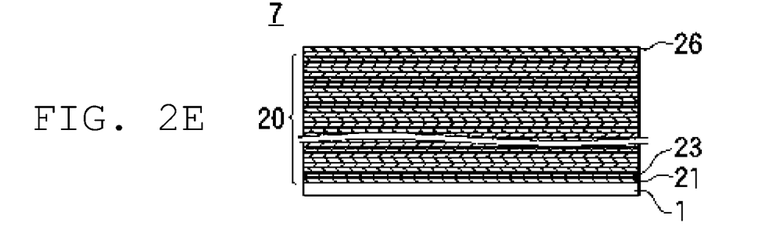

After the annealing treatment, a protective film 26 is formed on the birefringent film 20, if necessary, to obtain a phase difference element 7 of the present invention, as shown in FIG. 2E.

The amount of birefringence of the birefringent film 20 can be changed by controlling the first and the second angles θ and φ in forming the first and the second refractive films 21 and 23.

As the protective film 26, a thin film known as a protective film for a phase difference element and having relatively low moisture permeability can be applied. In addition, it is preferable that such a protective film 26 be provided with a function of an antireflective film (an AR film) to increase light transmittance. In this case, the AR film may be a multilayer thin film including a commonly used high refractive film and low refractive film. After the AR film is formed, the film can be cut into a desired size with a cutting apparatus such as a glass scriber.

In the above phase difference element 7, the birefringent film 20 is formed on the flat front surface of the transparent substrate 1 by oblique deposition. As illustrated by reference numeral 2 in FIG. 4, the phase difference element can be also formed by the following steps. The steps include: forming parallel grooves 31 on the front surface of a glass substrate (a quartz substrate) 33 by an etching method to make a transparent substrate 2 having linear elongated ridges 32 spaced from one another in parallel on the front surface of the glass substrate 33; and subsequently allowing the material vapor to arrive at the front surface of the elongated ridges 32 to grow the birefringent film on the front surface of the elongated ridges 32.

Figure 5:
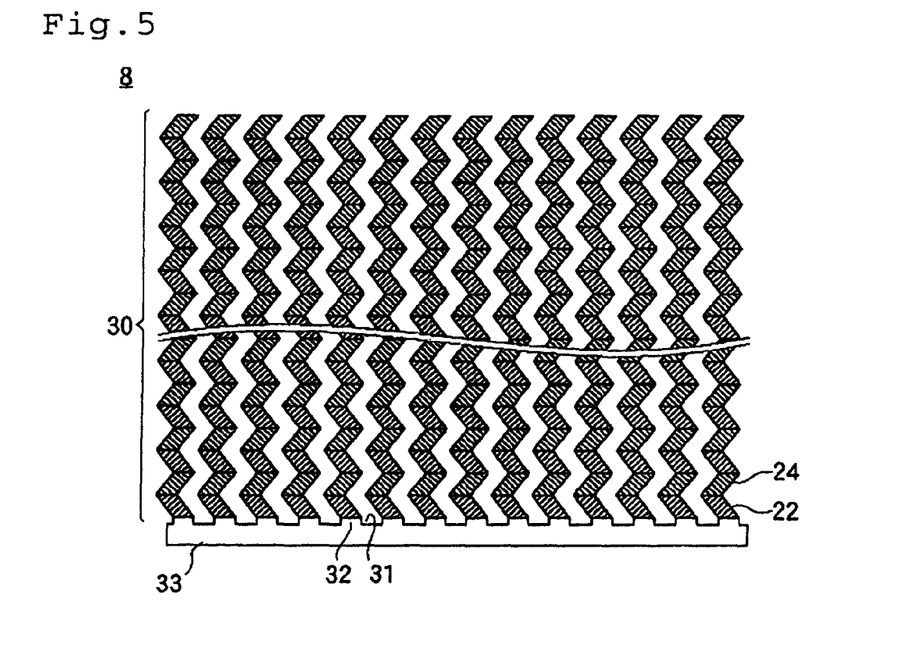
FIG. 5 is a schematic diagram illustrating the birefringent film formed on the transparent substrate.

As an example, a phase difference element 8 can be obtained by the following steps (FIG. 5). The steps include: forming the grooves 31 having a depth D of 50 nm with a fixed width and a fixed space in parallel on the glass substrate 33 to obtain the elongated ridges 32 with a distance P between adjacent center lines of a constant value of 150 nm; disposing the glass substrate 33 such that the first and the second angles θ and φ are set to, for example, 70° with respect to the deposition material containing $Ta_2O_5$ and $TiO_2$, as shown in FIG. 1; and allowing the material vapor to arrive at the glass substrate 33 to alternately laminate a plurality of the first and the second refractive films 22 and 24 on the front surface of the elongated ridges 32, thereby forming a birefringent film 30. In this case, in switching over formation of the first and the second refractive films, the transparent substrate can be rotated 180° to change the orientation of the transparent substrate with respect to the incident direction of the material vapor several times. The phase difference element 8 will have the birefringent film 30 having the first and the second refractive films 22 and 24 alternately laminated in a plurality of layers.

The distance P between adjacent center lines of the elongated ridges 32 is a pitch of the elongated ridges 32 wherein a plurality of columns of the elongated ridges 32 are disposed in parallel to one another. When the distance P between adjacent center lines is set to be shorter than the value of the shortest wavelength, large amount of birefringence is obtained for light having the shortest wavelength or more among light subjected to birefringence.

Further, when the birefringent films are formed on the elongated ridges 32 disposed in parallel to one another, the value of birefringence is increased. This is considered to be based on that influence of form birefringence is additionally exerted since the birefringent films formed on the adjacent elongated ridges 32 are spaced from one another thereby producing a gap therebetween, and an air space having lower refractive index than the first and the second refractive films is present between the birefringent films.

This grooves 31 and the elongated ridges 32 form so-called one dimensional lattice, and in the case of the wavelength or less, they can be obtained by random patterning or a pattern forming method with the block copolymer described in the literature (The Toshiba Review, vol. 60, No. 10, p. 32 (2005)), that is, the method including forming a film of $SiO_2$ on the glass substrate as in the method described above, pattering with the block copolymer, and transferring the pattern of the block copolymer on $SiO_2$.

Here, without forming a film of $SiO_2$, a pattern may be directly formed on the glass. In the wave plate produced in this manner, the phase difference element having excellent transmittance can be provided by use of the deposition material having the content of $Ta_2O_5+TiO_2$ such that the value of Ti/(Ti+Ta) ranges from 4.0 atomic % or higher and 30 atomic % or lower.

In the above description, it is assumed that the material vapor is emitted by increasing the temperature of the deposition material in which $Ta_2O_5$ and $TiO_2$ are mixed. However, the material vapor can also be obtained by disposing $Ta_2O_5$ and $TiO_2$ in different containers in the vacuum chamber, respectively, and increasing the temperature thereof individually to generate a vapor of $Ta_2O_5$ and a vapor of $TiO_2$ separately. In this case, the vapor of $Ta_2O_5$ and the vapor of $TiO_2$ arrive at the same transparent substrate simultaneously, and therefore they can be emitted from $Ta_2O_5$ and $TiO_2$ disposed separately so as to form the birefringent film in which the ratio of Ti to the total of Ta and Ti, (Ti/(Ta+Ti)), is 4.0 atomic % or higher and 30 atomic % or lower.

EXAMPLES

Examples 1 to 3, Comparative Examples 1 to 3

A deposition material to which $Ta_2O_5$ and $TiO_2$ were added was disposed in a vacuum chamber, and deposition was carried out at a first incident angle of 70° between the normal direction of a glass substrate (a quartz substrate) and the traveling direction of a material vapor incident on the glass substrate. Subsequently, the glass substrate was rotated 180° and then deposition was carried out at a second angle of 70° to form the birefringent film, thereby producing a phase difference element.

In this case, the deposition materials having different ratios of $Ta_2O_5$ and $TiO_2$ were disposed to form six types of birefringent films having different compositions, each of which was then subjected to the annealing treatment at 200° C. The values of Ti/(Ti+Ta) of the formed birefringent films were determined by the measuring instrument of EDX (energy dispersive X-ray spectroscopy), and the values of 0, 3.0, 5.0, 10, 19, 33 atomic % were obtained. The thickness of each birefringent film was set to 6.0 μm which was required for a broadband half-wave plate. The antireflective film was formed on the back surface of the glass substrate to decrease the reflectance of the incident light.

The values of Ti/(Ti+Ta) of the birefringent films were 0 atomic % for the phase difference element of Comparative Example 1, 3.0 atomic % for the phase difference element of Comparative Example 2, 5.0 atomic % for the phase difference element of Example 1, 10 atomic % for the phase difference element of Example 2, 19 atomic % for phase difference element of Example 3, and 33 atomic % for the phase difference element of Comparative Example 3.

To the birefringent film of phase difference element of each of Examples and Comparative Examples, three types of measuring lights having respective wavelengths of 680 to 600 nm, 590 to 520 nm, and 510 to 430 nm were irradiated, and the transmittance of measuring light having each wavelength (the mean value in each wavelength range) was determined.

Figure 6:
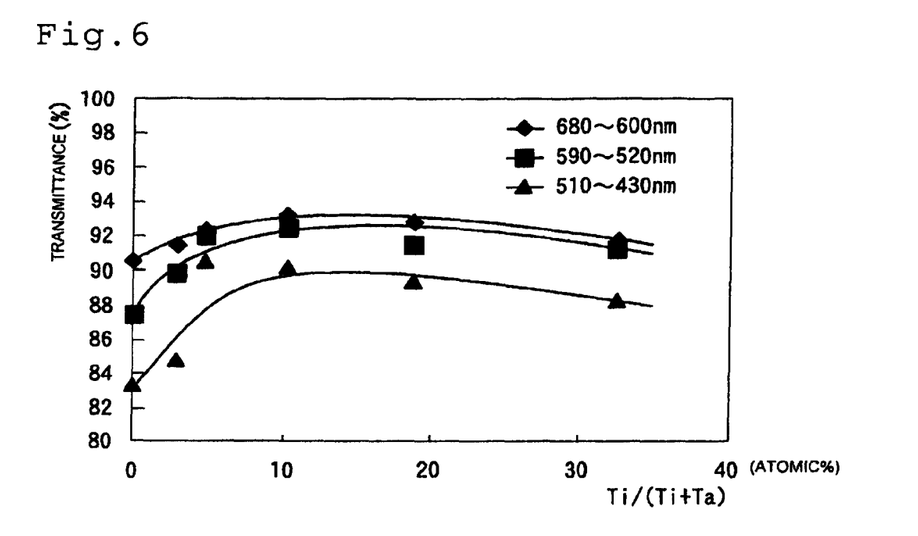
FIG. 6 is a graph showing the relationship between the value of Ti/(Ti+Ta) and transmittance.

In the graph of FIG. 6, the horizontal axis represents the value of Ti/(Ti+Ta), and the vertical axis represents the value of the transmittance. Based on the measurements for each birefringent film, it is found that the transmittance is increased in 4.0 atomic % or higher, and in particular, the transmittance is significantly increased in the wavelength range of blue light ranging from 510 to 430 nm. It is considered that the factors to increase the transmittance are that Ti serves as a getter of impurities and $TiO_2$ is activated to supply oxygen to the oxygen-deficient sites of $Ta_2O_5$.

On the other hand, it is found that the value of Ti/(Ti+Ta) exceeding 30 atomic % results in decreased transmittance, and lager content of $TiO_2$ results in decreased transmittance. The reason is considered that larger content of $TiO_2$ in the birefringent film increases the amount of light absorbed by $TiO_2$ since the optical absorption edge of $TiO_2$ is on the side of longer wavelength than $Ta_2O_5$ and $TiO_2$ readily absorbs visible light.

As a result, in particular, in the phase difference element having a thick birefringent film such as a broadband half-wave plate, the deposition material was disposed in the vacuum chamber to generate the material vapor, wherein the deposition material had the content ratio of $Ta_2O_5$ and $TiO_2$ such that the value of Ti/(Ti+Ta) of the birefringent film to be formed becomes 4.0 atomic % or higher and 30 atomic % or lower, and preferably 10 atomic % or higher and 20 atomic % or lower. In this manner, the phase difference element having excellent transmittance could be provided.

Example 4

Figure 4:
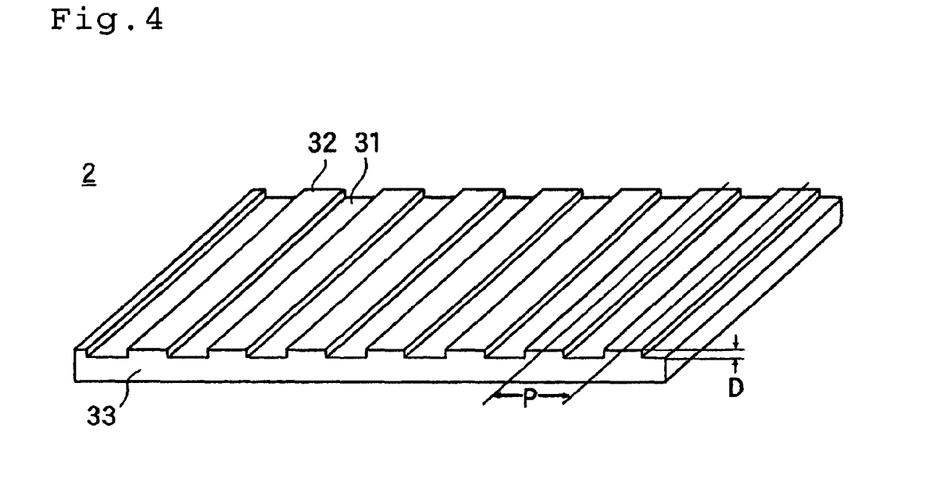
FIG. 4 is a schematic diagram illustrating the transparent substrate having elongated ridges on the front surface thereof.

In this Example, a phase difference element of the aspect shown in FIG. 4 and FIG. 5 was produced. More specifically, grooves having a depth of 50 nm with a fixed width and a fixed space in parallel were formed on a glass substrate to obtain elongated ridges with a distance between adjacent center lines of a constant value of 150 nm. The transparent substrate was disposed such that first and second angles θ and φ are set to 70° with respect to a deposition material containing $Ta_2O_5$ and $TiO_2$ as shown in FIG. 1. While the transparent substrate was rotated 180°, the material vapor was allowed to arrive at the transparent substrate to obtain the phase difference element of Example 4 having the birefringent film having a plurality of first and second refractive films alternately laminated on the front surface of the elongated ridges. In this case, the value of Ti/(Ti+Ta) was adjusted to 10 atomic %.

Birefringent films having the same composition and the same thickness were formed on the front surface of a flat transparent substrate (see FIG. 1) to produce a phase difference element. For this phase difference element and the phase difference element of Example 4, the birefringences Δn{Δn=$n_e$−$n_o$ ($n_e$: the refractive index of the extraordinary ray, $n_o$: the refractive index of the ordinary ray)} were determined, respectively.

Figure 7:
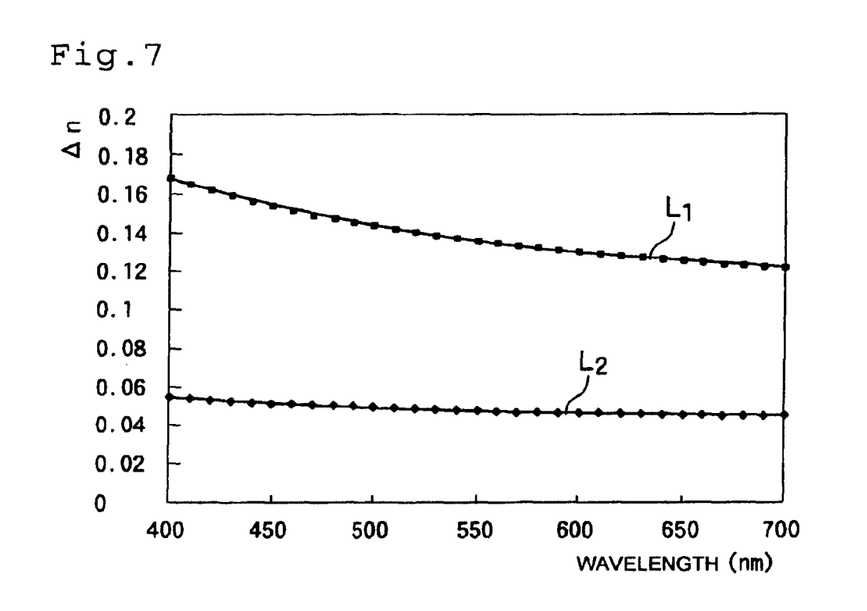
FIG. 7 is a graph showing the relationship between wavelength and birefringence Δn when the birefringent film is formed on the transparent substrate having elongated ridges and on the flat transparent substrate.

In the graph of FIG. 7, the horizontal axis represents the wavelength of the light, and the vertical axis represents the birefringence Δn. In this graph, the curve $L_1$ represents the measurements of the birefringent film of the phase difference element of Example 4 formed on the elongated ridges, and the curve $L_2$ represents the measurements of the birefringent film formed on the front surface of the flat transparent substrate. In FIG. 7, the amount of birefringence of the birefringent film formed on the elongated ridges was 2.8 times that of the birefringent film formed on the front surface of the flat transparent substrate. Thus, in the case of the phase difference element of Example 4, the thickness of the birefringent film required to obtain a desired amount of birefringence can be thinner than the transparent substrate with flat front surface in order to realize advantages such as increased speed and efficiency of manufacturing processes and low material cost used for forming a film.

INDUSTRIAL APPLICABILITY

The phase difference element of the present invention has high light transmittance and high birefringence properties. Accordingly, the phase difference element of the invention is useful for, for example, a viewing angle compensating film and a λ/4 plate for a liquid crystal display element such as a TFT-LCD and a reflective TFT-LCD.

DESCRIPTION OF REFERENCE NUMERALS 1, 2 . . . transparent substrate
14 . . . deposition material
18 . . . first oblique direction
21, 22 . . . first refractive film
23, 24 . . . second refractive film
20, 30 . . . birefringent film

The invention claimed is:

1. A phase difference element, comprising a transparent substrate and a birefringent film in which tantalum oxide and titanium oxide are obliquely deposited on one surface of the transparent substrate,
wherein:
the birefringent film comprises a plurality of first photorefractive films and second photorefractive films that are directly and alternately laminated to each other and have different oblique deposition directions,
a ratio of titanium atoms to a total of titanium atoms and tantalum atoms in the birefringent film is 4.0 atomic % or higher and 30 atomic % or lower,
each of the first photorefractive films and each of the second photorefractive films comprises crystal grains oriented along the oblique deposition direction, and each of the first photorefractive films and each of the second photorefractive films comprise tantalum oxide and titanium oxide, and
each of the first photorefractive films is a single layer and each of the second photorefractive films is a single layer.

2. The phase difference element according to claim 1, wherein the ratio of titanium atoms to the total of titanium atoms and tantalum atoms in the birefringent film is 10 atomic % or higher and 20 atomic % or lower.

3. The phase difference element according to claim 1, wherein the transparent substrate is a quartz glass substrate.

4. The phase difference element according to claim 1, wherein a component parallel to a front surface of the transparent substrate in the first oblique direction and a component parallel to the front surface of the transparent substrate in the second oblique direction are directed to respective directions opposite to each other.

5. A display device comprising: the phase difference element according to claim 1; and a liquid crystal display, wherein light passing through the liquid crystal display and the phase difference element is emitted from the display device.

6. A phase difference element, comprising a transparent substrate and a birefringent film, the birefringent film including a plurality of first photorefractive films and second photorefractive films that are directly and alternately laminated to each other, each of the first photorefractive films being grown on the transparent substrate or one of the second photorefractive films along a first oblique direction from which a material vapor enters, the material vapor being emitted from a deposition material containing $Ta_2O_5$ and $TiO_2$ and going straight ahead, and each of the second photorefractive films being grown on one of the first photorefractive films along a second oblique direction from which the material vapor enters, the second oblique direction being different from the first oblique direction,
wherein:
a ratio of Ti to a total of Ta and Ti, (Ti/(Ta+Ti)), of the first and the second photorefractive films is 4.0 atomic % or higher and 30 atomic % or lower,
each of the first photorefractive films comprises crystal grains oriented along the first oblique direction and each of the second photorefractive films comprises crystal grains oriented along the second oblique direction, and each of the first photorefractive films and each of the second photorefractive films comprise tantalum oxide and titanium oxide, and
each of the first photorefractive films is a single layer and each of the second photorefractive films is a single layer.

7. The phase difference element according to claim 6, wherein the ratio of Ti to the total of Ta and Ti, (Ti/(Ta+Ti)), of the first and the second photorefractive films is 10 atomic % or higher and 20 atomic % or lower.

8. A method for producing a phase difference element, comprising:
obliquely depositing $Ta_2O_5$ and $TiO_2$ on a transparent substrate in a first oblique direction to form a first photorefractive film, and obliquely depositing $Ta_2O_5$ and $TiO_2$ on the first photorefractive film in a second oblique direction to form a second photorefractive film, the second oblique direction being different from the first oblique direction, and
forming a birefringent film having a plurality of first photorefractive films and second photorefractive films that are directly and alternately laminated to each other, wherein $Ta_2O_5$ and $TiO_2$ are obliquely deposited such that
a ratio of titanium atoms to a total of titanium atoms and tantalum atoms in the birefringent film is 4.0 atomic % or higher to 30 atomic % or lower,
each of the first photorefractive films comprises crystal grains oriented along the first oblique direction and each of the second photorefractive films comprises crystal grains oriented along the second oblique direction, and each of the first photorefractive films and each of the second photorefractive films comprise tantalum oxide and titanium oxide, and
each of the first photorefractive films is a single layer and each of the second photorefractive films is a single layer.

9. The method for producing a phase difference element according to claim 8, comprising, after forming the birefringent film, performing an annealing treatment.

* * * * *